(12) United States Patent
Wierzchowiec et al.

(10) Patent No.: US 9,954,173 B2
(45) Date of Patent: *Apr. 24, 2018

(54) ORGANIC SEMICONDUCTING FORMULATION (71) Applicant: Merck Patent GmbH, Darmstadt (DE)

(72) Inventors: Piotr Wierzchowiec, Southampton (GB); Pawel Miskiewicz, Cambridge, MA (US)

(73) Assignee: Merck Patent GmbH, Darmstadt (DE)

( * ) Notice: Subject to any disclaimer, the term of this patent is extended or adjusted under 35 U.S.C. 154(b) by 182 days.

This patent is subject to a terminal disclaimer.

(21) Appl. No.: 14/419,948

(22) PCT Filed: Jul. 18, 2013

(86) PCT No.: PCT/EP2013/002137
§ 371 (c)(1),
(2) Date: Feb. 6, 2015

(87) PCT Pub. No.: WO2014/023392
PCT Pub. Date: Feb. 13, 2014

(65) Prior Publication Data
US 2015/0221868 A1    Aug. 6, 2015

(30) Foreign Application Priority Data
Aug. 9, 2012   (EP) .................................... 12005793

(51) Int. Cl.
*H01L 51/00* (2006.01)
*H01L 51/05* (2006.01)

(52) U.S. Cl.
CPC ........ *H01L 51/004* (2013.01); *H01L 51/0003* (2013.01); *H01L 51/0094* (2013.01); *H01L 51/052* (2013.01); *H01L 51/0002* (2013.01); *H01L 51/0007* (2013.01); *H01L 51/0026* (2013.01); *H01L 51/0052* (2013.01); *H01L 51/0068* (2013.01); *H01L 51/0541* (2013.01); *H01L 51/0545* (2013.01); *H01L 51/0558* (2013.01); *Y02E 10/549* (2013.01)

(58) Field of Classification Search
CPC . H01L 51/0003; H01L 51/052; H01L 51/004; H01L 51/0094; H01L 51/0541; H01L 51/0545; H01L 51/0068; H01L 51/0558; H01L 51/0026; H01L 51/0007; H01L 51/0002; H01L 51/0052; Y02E 10/549
USPC ................. 252/500; 257/40; 438/99
See application file for complete search history.

(56) References Cited

U.S. PATENT DOCUMENTS

| 5,952,396 | A  | * | 9/1999  | Chang ...................... C08L 23/16 522/1 |
| 6,403,397 | B1 | * | 6/2002  | Katz .................... H01L 51/0004 438/29 |
| 7,576,208 | B2 |   | 8/2009  | Brown et al. |
| 7,807,993 | B2 |   | 10/2010 | Brown et al. |
| 7,842,942 | B2 |   | 11/2010 | Brown et al. |
| 7,846,412 | B2 | * | 12/2010 | Nie ................... A61K 47/48861 423/414 |
| 8,119,804 | B2 |   | 2/2012  | Brown et al. |
| 8,896,071 | B2 |   | 11/2014 | Von Werne et al. |
| 9,425,417 | B2 | * | 8/2016  | Wierzchowiec .... H01L 51/0032 |
| 2004/0044111 | A1 | * | 3/2004 | Kakarala ................. C08L 23/10 524/442 |
| 2006/0166093 | A1 | * | 7/2006 | Zaghib ................... H01G 11/42 429/217 |
| 2007/0102696 | A1 |   | 5/2007  | Brown et al. |
| 2007/0137520 | A1 |   | 6/2007  | Brown et al. |
| 2008/0009625 | A1 |   | 1/2008  | Brown et al. |
| 2010/0155708 | A1 |   | 6/2010  | Von Werne et al. |
| 2010/0213455 | A1 | * | 8/2010 | James .................... B82Y 10/00 257/40 |
| 2010/0227956 | A1 |   | 9/2010  | Brown et al. |
| 2010/0331509 | A1 |   | 12/2010 | Zhang et al. |
| 2011/0042651 | A1 | * | 2/2011 | Koenemann ......... C07D 221/14 257/40 |
| 2011/0250396 | A1 | * | 10/2011 | Matsutani ............. G03F 7/0236 428/156 |
| 2012/0070746 | A1 | * | 3/2012 | Mikhaylik .......... H01M 2/1673 429/231.95 |
| 2012/0171444 | A1 | * | 7/2012 | Haruta .................... B32B 27/08 428/217 |

(Continued)

FOREIGN PATENT DOCUMENTS

| WO | WO 2011076325 | A1 | * | 6/2011 | ............... C09D 5/24 |
| WO |    2011151463 | A1 |   | 12/2011 |
| WO |    2013/050401 | A2 |   | 4/2013 |

OTHER PUBLICATIONS

J. Day et al., "Influence of organic semiconductor-metal interfaces on the photoresponse of functionalized anthradithiophene thin films", Journal of Applied Physics, 105, 103703-1 to 10 (2009).*
Kimberly C. Dickey et al., "Large-area patterning of a solution-processable organic semiconductor to reduce parasitic leakage and off currents in thin-film transistors", Applied Physics Letters, 90,244103-1 to 3 (2007).*
Stephanie S. Lee et al., "Understanding Heterogeneous Nucleation in Binary, Solution-Processed, Organic Semiconductor Thin Films", Chemistry of Materials, 24. 2920-2928 (2012) (published Jul. 6, 2012).*
Chinese Office Action corresponding to CN Application No. 2013/80041541.2, dated Nov. 4, 2016.

(Continued)

*Primary Examiner* — Douglas J McGinty
(74) *Attorney, Agent, or Firm* — Millen White Zelano & Branigan, P.C.

(57) ABSTRACT

The invention generally relates to formulations for use in organic semiconductor layers of organic electronic devices, and more specifically in organic field effect transistors, to organic semiconductor layers prepared from such formulations, and to organic electronic devices and organic field effect transistors encompassing such organic semiconductor layers.

29 Claims, 2 Drawing Sheets

(56) References Cited

U.S. PATENT DOCUMENTS

| | | | | |
|---|---|---|---|---|
| 2012/0273736 A1* | 11/2012 | James | ...................... | C09D 5/24 |
| | | | | 252/519.21 |
| 2013/0153869 A1 | 6/2013 | Mikalo et al. | | |
| 2015/0136224 A1* | 5/2015 | Shi | ...................... | H01L 51/0074 |
| | | | | 136/256 |
| 2015/0243914 A1* | 8/2015 | Wierzchowiec | .... | H01L 51/0032 |
| | | | | 257/40 |
| 2016/0181552 A1* | 6/2016 | May | ...................... | C09K 11/06 |
| | | | | 257/40 |

OTHER PUBLICATIONS

European Examination Report corresponding to EP 13 739 613.1, dated Sep. 9, 2016.
International Search Report from PCT Application No. PCT/EP2013/002137 dated Aug. 27, 2013.

* cited by examiner

ORGANIC SEMICONDUCTING FORMULATION

TECHNICAL FIELD

The invention generally relates to formulations for use in organic semiconductor layers of organic electronic devices, and more specifically in organic field effect transistors, to organic semiconductor layers prepared from such formulations, and to organic electronic devices and organic field effect transistors encompassing such organic semiconductor layers.

BACKGROUND

In recent years there has been growing interest in organic electronic (OE) devices, for example organic field effect transistors (OFET) for use in backplanes of display devices or logic capable circuits, and organic photovoltaic (OPV) devices. A conventional OFET comprises a gate electrode, a gate insulator layer made of a dielectric material (also referred to as "dielectric" or "gate dielectric"), source and drain electrodes, a semiconducting layer made of an organic semiconductor (OSC) material, and often a passivation layer on top of the aforementioned layers to protect them against environmental influence and/or against damage from subsequent device manufacturing steps.

For OFET devices solution processable OSC layers are especially desired. The OSC materials should be solution based and should be suitable for solution based deposition methods like spin-coating, slot-die coating and doctor blade coating, or wider area printing methods such as flexo, gravure, and screen printing. Key requirements for OSC materials used in such solution processed layers are orthogonality of the OSC solvent towards the underlying layer, and good adhesion of the OSC to the underlying layer and to the layer deposited on top of the OSC layer.

Polymeric binders are commonly used with solution processed OSCs to increase performance of Organic Field Effect Transistors (OFET), as disclosed for example in *J. Mater. Chem.*, 2008, 18, 3230-3236, or *Appl. Phys. Lett.*, 2009, 94, 013506-013506-3, or to increase processability of the OSC formulation, as disclosed for example in US 2004/0038459 A1.

However, OSC formulations containing the commonly used polymeric binders, such as polystyrene, poly(4-methylstyrene), poly(α-methylstyrene), poly(4-vinylbiphenyl), and poly(triarylamine) for example, have some drawbacks in certain applications, like for example weak adhesion to available top coatings such as gate dielectrics or passivation layers.

Currently some of the most commonly used top gate dielectrics for OFETs are materials having low permittivity (also known as relative permittivity or dielectric constant) of less than 3.0 ("low k material"). The use of such low k materials is reported to reduce charge trapping at the dielectric/OSC interface and to give improved transistor performance, as disclosed for example in *Adv. Funct. Mat.*, 2003, 13, 199-204, or in U.S. Pat. No. 7,029,945 B2.

Typical examples of such low-k dielectrics, which are orthogonal to many OSCs are the following:

1) Solution processable fluorinated materials, like those of the Teflon AF™ (DuPont) or Cytop™ (AGJ) series, as disclosed for example in US 2011/0037064 A1 or in *Adv. Mat.*, 2009, 21, 1166-1171.

2) chemical vapor deposited poly(p-xylylene), also known as "Parylene", as disclosed for example in *Appl. Phys. Lett.*, 2008, 93, 183305 1-3.

In addition, in order to improve the mechanical integrity within the stack of layers present in OE devices, for example in bottom gate OFET devices, passivation layers are commonly applied on top of OSC. The passivation layers have to meet the same orthogonality and adhesion requirements as the abovementioned dielectric layers in top gate configuration.

Parylene (poly(p-xylylene)) is a dielectric material that is often used in the dielectric or passivation layers of OE devices including OFETs. Parylene is a commercially available dielectric which polymerizes when being deposited on a substrate from a vaporized p-xylylene monomer. The advantage of Parylene is its relatively simple processing, resulting in a highly pure and homogeneous thin film, which is an excellent chemical barrier, both thermally stable and UV stable.

However, the adhesion of Parylene to the commonly used binder/OSC compositions, and also to many commonly available polymers which are typically used as binders, like those listed above is often very low, in many cases lower than 0.05N, but typically below detection level.

Therefore, it is desired to have available OSC compositions that show improved adhesion to Parylene layers used as dielectric or passivation layers in OE devices.

One aim of the present invention is to provide materials for use in OSC layers which meet these requirements. Another aim is to provide improved methods of manufacturing such OSC layers. Another aim is to provide improved OE devices, in particular OFETs, comprising such improved OSC layers and dielectric or passivation layers comprising Parylene. Further aims are immediately evident to the person skilled in the art from the following description.

The inventors have found these aims can be achieved by providing an OSC formulation that comprises an adhesion promoter which improves the adhesion of the OSC to Parylene, while providing good device performance.

SUMMARY

The invention relates to a formulation comprising an organic semiconductor and further comprising a polymeric additive, said additive comprising one or more reactive groups, which are preferably capable of reacting with a p-xylylene, said formulation optionally further comprising a solvent.

The invention further relates to an organic semiconductor layer obtained through the use of a formulation in accordance with the invention.

The invention further relates to an organic electronic device comprising an organic semiconductor layer and a dielectric or passivation layer, wherein the organic semiconductor layer is obtained through the use of a formulation comprising an organic semiconductor and a polymeric additive, said additive comprising one or more reactive groups, and the dielectric or passivation layer comprises a poly(p-xylylene).

The organic electronic device is preferably an Organic Field Effect Transistor (OFET), including Organic Thin Film Transistor (OTFT) as a particular case, an Organic Light Emitting Diode (OLED), an Organic Photovoltaic (OPV) device or Organic Photodetector (OPD), very preferably a top gate OTFT or a bottom gate OTFT.

The invention further relates to a product or an assembly comprising an organic electronic device as described above and below. Such product or assembly is preferably an Integrated Circuit (IC), a Radio Frequency Identification (RFID) tag, a security marking or security device containing an RFID tag, a Flat Panel Display (FPD), a backplane of an FPD, a backlight of an FPD, an electrophotographic device, an electrophotographic recording device, an organic memory device, a pressure sensor, an optical sensor, a chemical sensor, a biosensor or a biochip.

The invention further relates to a process of preparing an organic semiconductor layer from a formulation in accordance with the invention.

The invention further relates to a process of preparing an organic electronic device, especially a top gate OFET or bottom gate OFET, comprising an organic semiconductor layer in accordance with the invention.

BRIEF DESCRIPTION OF THE DRAWINGS

Embodiments of the invention are described below with reference to the following drawings.

DETAILED DESCRIPTION

As used herein, the term "Organic Field Effect Transistors (OFETs)" will be understood to be inclusive of the subclass of such devices known as "Organic Thin Film Transistors (OTFTs)".

In addition, it will be understood that the terms "dielectric" and "insulating" are used interchangeably herein. Thus reference to an insulating material or layer is inclusive of a dielectric material or layer. Further, as used herein, the term "organic electronic device" will be understood to be inclusive of the term "organic semiconductor device" and the several specific implementations of such devices such as the OFETs as defined above.

The terms "Parylene" and "poly(p-xylylene)" are used interchangeably herein, thus reference to Parylene is inclusive of a poly(p-xylylene) and vice versa. Parylene is the generic tradename for a series of chemical vapor deposited poly(p-xylylenes). Parylene is usually prepared by chemical vapor deposition of a p-xylylene intermediate of the following structure which is optionally substituted as described below. The p-xylylene intermediate can be derived from [2.2]paracyclophane of the following structure The phenylene rings and/or the methylene groups of the p-xylylene repeating units in the polymers may also be substituted. The polymers may also comprise two or more distinct types of unsubstituted and/or substituted p-xylylene repeating units. For example, Parylene N denotes unsubstituted poly(p-xylylene) of the following structure while Parylene C and Parlyene D denote mono- or dichlorinated poly(p-xylylene) of the following structure, respectively Further Parylene types include for example those wherein the phenylene or methylene groups are fluorinated, like Parylene AF-4, Parylene SF, or Parylene HT all comprising difluorinated methylene groups, or Parylene VT comprising a fluorinated phenylene. Further Parylene types include reactive co-polymers comprising unsubstituted p-xylylene units (as in Parylene N) and p-xylylene units wherein the phenylene ring is substituted by a reactive or crosslinkable group, for example by an amine (Parylene A), a methylamine (Parylene AM), or an ethynyl group (Parylene X).

Unless stated otherwise, the terms "Parylene" and "poly (p-xylylene)" as used hereinafter, will be understood to include both unsubstituted and substituted Parylene types, including but not limited to Parylene N, C, D, AF-4, SF, HT, VT, A, AM, X etc.

As used herein, the terms "orthogonal" and "orthogonality" will be understood to mean chemical orthogonality. For example, an orthogonal solvent means a solvent which, when used in the deposition of a layer of a material dissolved therein on a previously deposited layer, does not dissolve said previously deposited layer.

As used herein, the term "polymer" will be understood to mean a molecule that encompasses a backbone of one or more distinct types of repeating units (the smallest constitutional unit of the molecule) and is inclusive of the commonly known terms "oligomer", "copolymer", "homopolymer" and the like. Further, it will be understood that the term polymer is inclusive of, in addition to the polymer itself, residues from initiators, catalysts and other elements attendant to the synthesis of such a polymer, where such residues are understood as not being covalently incorporated thereto. Further, such residues and other elements, while normally removed during post polymerization purification processes, are typically mixed or co-mingled with the polymer such that they generally remain with the polymer when it is transferred between vessels or between solvents or dispersion media.

As used herein, the term "small molecule" will be understood to mean a monomeric compound which typically does not contain a reactive group by which it can be reacted to form a polymer, and which is designated to be used in monomeric form. In contrast thereto, the term "monomer" unless stated otherwise will be understood to mean a monomeric compound that carries one or more reactive functional groups by which it can be reacted to form a polymer.

As used herein, the term "organic semiconductor (OSC) formulation", also shortly referred to as "formulation", means at least one organic semiconductor (OSC) compound and one or more other materials added to the at least one OSC compound to provide, or to modify, specific properties of the OSC formulation and or the at least one OSC compound therein. It will be understood that an OSC formulation is also a vehicle for carrying the OSC to a substrate to enable the forming of layers or structures thereon. Exemplary materials include, but are not limited to, solvents, volatile surfactants and adhesion promoters.

This invention presents a novel concept of adding a polymeric additive, which acts as an adhesion promoter, to the OSC formulation used for preparing the OSC layer of an OE device, and using materials including polymeric additive added to OSC formulations, which improve the adhesion of a dielectric or passivation layer, which comprises Parylene, to the OSC layer of the OE device, while providing good device performance.

As mentioned above, the adhesion of Parylene to typical binder/OSC compositions as used in prior art, and also to many commonly available polymers which are typically used as binders, is lower than 0.05N, but typically below detection level. Therefore, in order to improve the adhesion of Parylene to the OSC layer, the formulation in accordance with the present invention comprises a polymeric additive that acts as an adhesion promoter, and can in addition also act as binder.

The polymeric additive is selected such that it contains at least one type of reactive groups. The reactive groups are preferably selected from reactive groups that are capable of reacting with free radicals of p-xylylene, which is the moiety that exists in certain conditions during chemical vapour deposition in the process of forming a Parylene layer. The reactive groups of the polymeric additive should also be selected such that they do not yield any by-products at the interface between the OSC layer and the Parylene layer after such reaction.

Without wishing to be bound to a specific theory, it is believed that one or more of the reactive groups of the polymeric additive, which is comprised in the OSC layer, will react with unsaturated groups of the p-xyxlylene, which is used for forming the Parylene layer, at the interface between the OSC layer and the Parylene layer during vapor deposition of the p-xylylene. It is further believed that this results in chemical bonding between the polymeric additive of the OSC layer and the poly(p-xylylene) of the Parylene layer at the interface between these two layers, thus increasing the adhesion between the two layers. An additional process step for crosslinking or curing the polymeric additive is thus not required.

The reactive groups in the polymeric additive are preferably pendant reactive groups that are attached to a polymer backbone.

In a preferred embodiment of the present invention, the polymeric additive comprises one or more divalent repeating units selected of formula I wherein $B^1$ denotes a first backbone unit, $B^2$ denotes on each occurrence identically or differently a second, third or fourth backbone unit, Sp denotes a spacer group, a single bond or a spiro linkage, P denotes a reactive group or together with Sp forms a reactive group, which is preferably capable of reacting with p-xylylene, and a is 0, 1, 2 or 3.

In another preferred embodiment of the present invention, the polymeric additive is a polymer selected of formula II wherein $B^1$, $B^2$, Sp, P and a are as defined in formula I, and n is an integer>1.

In a preferred embodiment, Sp in formula I and II is a single bond, or an alkylene group with 1 to 20 C atms, very preferably 1 to 12 C atoms, wherein one or more $CH_2$ groups are optionally replaced by —O—, —S—, —CO—, $NR^0R^{00}$, or denotes a single bond, wherein $R^0$ and $R^{00}$ independently of each other denote H or alkyl with 1 to 12 C-atoms.

In another preferred embodiment, P in formula I and II denotes or comprises an unsaturated hydrocarbon group, an O-aryl group or an S-aryl group, and is very preferably selected from an alkene group, an alkyne group, a phenyl-sulfanyl group and an optionally substituted norbornene group. Very preferred groups P are vinyl, ethynyl, phenyl-sulfanyl and norbornene.

In another preferred embodiment, Sp-P in formula I and II denotes a spiro-connected norbornene group. Preferred backbones units —B1(Sp-P)-according to this preferred embodiment include for example 5-methylene-2-norbornene of formula I1

Further preferred backbone units $B^1$ in $B^2$ in formula I and II are selected from saturated or unsaturated alkylene with 1 to 8 C atoms, preferably 1 to 4 C atoms, preferably methylene, ethylene and propylene.

The co-units $B^2$ can also be selected to optimize other physicochemical properties of the polymeric additive, the OSC formulation comprising the polymeric additive, and/or the OSC layer that is formed from said OSC formulation, such as the viscosity, smoothness, morphology, hardness, solubility, etc.

In another preferred embodiment the polymeric additive comprises one or more repeating units selected from 1-phenylsulfanyl-ethylene, methylene, ethylene, propylene, 5-methylene-2-norbornene, or combinations of the aforementioned.

The polymeric additives are either commercially available, or can be synthesized according to or in analogy to methods that are known to the skilled person and are described in the literature.

Especially preferred polymeric additives are selected from poly (ethylene-co-propylene-co-5-methylene-2-norbornene) of formula II1 below and poly(vinyl phenyl sulfide) of formula II2 below. These polymers are commercially available.

wherein n is an integer>1 and x, y and z are >0 and <1, with x+y+z=1.

The inventors of the present invention have observed for example that the adhesion of Parylene C to each of aforementioned two polymers is higher than 10N, while the adhesion of Parylene C to polymers such as polystyrene, and also to OSCs for example based on oligoacenes like fluorinated bis(trialkylsilylethynyl) anthradithiophene, is close to zero. It was further observed that the use of one of the two aforementioned polymers as polymeric additive in an OSC formulation comprising the aforementioned oligoacene can increase adhesion of for example Parylene C to the OSC layer to 0.9N, depending on the formulation composition. The performance of an OFET comprising such an OSC layer is comparable to that of an OFET comprising an OSC layer with the same OSC but without the polymeric additive.

In an OSC formulation in accordance with the present invention, the polymeric additive can either be an additional component of the OSC formulation, like the polymers disclosed above, which replaces the conventional polymeric binders (like polystyrene), or alternatively the polymeric additive can also be used together with other conventional polymeric binders in the OSC formulation.

The organic semiconductor (OSC) layer can be an n- or p-type OSC. Effective OSCs exhibit a FET mobility of greater than $1 \times 10^{-5}$ cm$^2$V$^{-1}$s$^{-1}$.

OSC embodiments in accordance with the present invention are especially suitable for use ing OFETs where the OSC is used as the active channel material. OSCs for such embodiments can be deposited by any of the previously discussed deposition methods, but as they are generally deposited or formed as blanket layers, solvent coated methods such as spray-, dip-, web- or spin-coating, doctor blade, bar and slot-die coating or printing methods such as ink-jet printing, flexo printing, gravure printing, or screen printing are typically employed to allow for ambient temperature processing.

The OSC material employed for electronic device embodiments in accordance with the present invention can be any conjugated molecule, for example an aromatic molecule containing preferably two or more, very preferably at least three aromatic rings. In some preferred embodiments of the present invention, the OSC contains aromatic rings selected from 5-, 6- or 7-membered aromatic rings, while in other preferred embodiments the OSC contains aromatic rings selected from 5- or 6-membered aromatic rings. The OSC material may be a monomer, oligomer or polymer, including mixtures, dispersions and blends of one or more of monomers, oligomers or polymers.

Each of the aromatic rings of the OSC optionally contains one or more hetero atoms selected from Se, Te, P, Si, B, As, N, O or S, generally from N, O or S. Further, the aromatic rings may be optionally substituted with fluoro, cyano, alkyl, alkoxy, polyalkoxy, thioalkyl, silyl, ethynylsilyl, optionally substituted secondary or tertiary alkylamine or arylamine, aryl or substituted aryl groups, wherein ethynylsilyl groups are represented by —C≡C—SiR'R"R''', and substituted secondary or tertiary alkylamine or arylamine are represented by —N(R')(R"), wherein R' and R" are each independently H, optionally fluorinated $C_{1-12}$ alkyl or optionally fluorinated $C_{6-10}$ aryl.

The aforementioned aromatic rings can be fused rings or linked with a conjugated linking group such as —C(T')=C(T")—, —C≡C—, —N(R'''')—, —N=N—, (R'''')=N—, —N=C(R'''')—, where T' and T" each independently represent H, Cl, F, —C≡N or lower alkyl groups such as $C_{1-4}$ alkyl groups and R'''' is as defined above.

In some preferred OE device embodiments of the present invention, OSC materials that can be used include small molecule compounds, oligomers and derivatives of compounds selected from the group consisting of condensed aromatic hydrocarbons such as, tetracene, chrysene, pentacene, pyrene, perylene, coronene, or soluble substituted and/or heterocylic derivatives of the aforementioned; oligomeric para substituted phenylenes such as p-quaterphenyl (p-4P), p-quinquephenyl (p-5P), p-sexiphenyl (p-6P) or soluble substituted derivatives of these; benzidine compounds; stilbene compounds; triazines; substituted metallo- or metal-free porphines, phthalocyanines, fluorophthalocyanines, naphthalocyanines or fluoronaphthalocyanines; $C_{60}$ and $C_{70}$ fullerenes; N,N'-dialkyl, substituted dialkyl, diaryl or substituted diaryl-1,4,5,8-naphthalenetetracarboxylic diimide and fluoro derivatives; N,N'-dialkyl, substituted dialkyl, diaryl or substituted diaryl 3,4,9,10-perylenetetracarboxylicdiimide; bathophenanthroline; diphenoquinones; 1,3,4-oxadiazoles; 11,11,12,12-tetracyanonaptho-2,6-quinodimethane; α,α'-bis(dithieno[3,2-b2',3'-d]thiophene); 2,8-dialkyl, substituted dialkyl, diaryl or substituted diaryl anthradithiophene; 2,2'-bibenzo[1,2-b:4,5-b]dithiophene. Where a liquid deposition technique of the OSC is desired, compounds from the above list and derivatives thereof are limited to those that are soluble in an appropriate solvent or mixture of appropriate solvents.

In other preferred embodiments of the present invention, the OSC materials are substituted oligoacenes such as pentacene, tetracene or anthracene, or heterocyclic derivatives thereof. Bis(trialkylsilylethynyl) oligoacenes or bis(trialkylsilylethynyl) heteroacenes, for example fluorinated bis(trialkylsilylethynyl) anthradithiophenes, as disclosed for example in U.S. Pat. No. 6,690,029, WO 2005/055248 A1 or U.S. Pat. No. 7,385,221, are especially preferred.

In other preferred embodiments of the present invention, the OSC materials are selected from organic semiconducting polymers, including conjugated hydrocarbon polymers such as polyacene, polyphenylene, poly(phenylene vinylene), polyfluorene; and conjugated heterocyclic polymers such as poly(3-substituted thiophene), poly(3,4-bisubstituted thiophene), optionally substituted polythieno[2,3-b]thiophene, optionally substituted polythieno[3,2-b]thiophene, poly(3-substituted selenophene), polybenzothiophene, polyisothianaphtene, poly(N-substituted pyrrole), poly(3-substituted pyrrole), poly(3,4-bisubstituted pyrrole), polyfuran, polypyridine, poly-1,3,4-oxadiazoles, polyisothianaphthene, poly(N-substituted aniline), poly(2-substituted aniline), poly(3-substituted aniline), poly(2,3-bisubstituted aniline), polyazulene, polypyrene; pyrazoline compounds; polyselenophene; polybenzofuran; polyindole; polypyridazine.

Further, in some preferred embodiments in accordance with the present invention, the OSC materials are polymers or copolymers that encompass one or more repeating units selected from thiophene-2,5-diyl, 3-substituted thiophene-2,5-diyl, optionally substituted thieno[2,3-b]thiophene-2,5-diyl, optionally substituted thieno[3,2-b]thiophene-2,5-diyl, selenophene-2,5-diyl, or 3-substituted selenophene-2,5-diyl.

Further preferred p-type OSCs are copolymers comprising electron acceptor and electron donor units. Preferred copolymers of this preferred embodiment are for example copolymers comprising one or more benzo[1,2-b:4,5-b']dithiophene-2,5-diyl units that are preferably 4,8-disubstituted by one or more groups R as defined above, and further comprising one or more aryl or heteroaryl units selected from Group A and Group B, preferably comprising at least one unit of Group A and at least one unit of Group B, wherein Group A consists of aryl or heteroaryl groups having electron donor properties and Group B consists of aryl or heteroaryl groups having electron acceptor properties, and preferably Group A consists of selenophene-2,5-diyl, thiophene-2,5-diyl, thieno[3,2-b]thiophene-2,5-diyl, thieno[2,3-b]thiophene-2,5-diyl, selenopheno[3,2-b]selenophene-2,5-diyl, selenopheno[2,3-b]selenophene-2,5-diyl, selenopheno[3,2-b]thiophene-2,5-diyl, selenopheno[2,3-b]thiophene-2,5-diyl, benzo[1,2-b:4,5-b']dithiophene-2,6-diyl, 2,2-dithiophene, 2,2-diselenophene, dithieno[3,2-b:2',3'-d]silole-5,5-diyl, 4H-cyclopenta[2,1-b:3,4-b]dithiophene-2,6-diyl, 2,7-di-thien-2-yl-carbazole, 2,7-di-thien-2-yl-fluorene, indaceno[1,2-b:5,6-b]dithiophene-2,7-diyl, benzo[1'',2'':4,5;4'',5'':4',5]bis(silolo[3,2-b:3',2'-b]thiophene)-2,7-diyl, 2,7-di-thien-2-yl-indaceno[1,2-b:5,6-b']dithiophene, 2,7-di-thien-2-yl-benzo[1'',2'':4,5;4'',5'':4',5]bis(silolo[3,2-b:3',2'-b]thiophene)-2,7-diyl, and 2,7-di-thien-2-yl-phenanthro[1,10,9,8-c,d,e,f,g]carbazole, all of which are optionally substituted by one or more, preferably one or two groups R as defined above, and Group B consists of benzo[2,1,3]thiadiazole-4,7-diyl, 5,6-dialkyl-benzo[2,1,3]thiadiazole-4,7-diyl, 5,6-dialkoxybenzo[2,1,3]thiadiazole-4,7-diyl, benzo[2,1,3]selenadiazole-4,7-diyl, 5,6-dialkoxy-benzo[2,1,3]selenadiazole-4,7-diyl, benzo[1,2,5]thiadiazole-4,7,diyl, benzo[1,2,5]selenadiazole-4,7,diyl, benzo[2,1,3]oxadiazole-4,7-diyl, 5,6-dialkoxy-benzo[2,1,3]oxadiazole-4,7-diyl, 2H-benzotriazole-4,7-diyl, 2,3-dicyano-1,4-phenylene, 2,5-dicyano,1,4-phenylene, 2,3-difluoro-1,4-phenylene, 2,5-difluoro-1,4-phenylene, 2,3,5,6-tetrafluoro-1,4-phenylene, 3,4-difluorothiophene-2,5-diyl, thieno[3,4-b]pyrazine-2,5-diyl, quinoxaline-5,8-diyl, thieno[3,4-b]thiophene-4,6-diyl, thieno[3,4-b]thiophene-6,4-diyl, and 3,6-pyrrolo[3,4-c]pyrrole-1,4-dione, all of which are optionally substituted by one or more, preferably one or two groups R as defined above.

In OSC formulations in accordance with the present invention that comprise a polymeric OSC, the concentration of the polymeric additive can be higher than in OSC formulations that comprise a small molecule OSC.

Where appropriate and needed to adjust the rheological properties as described for example in WO 2005/055248 A1, some embodiments of the present invention employ OSC compositions that include one or more organic binders in addition to the polymeric additive. However, preferably the OSC composition does not include an organic binder apart from the polymeric additive.

In preferred embodiments in accordance with the present invention, deposition and/or forming of the OSC layer are performed using solution processing techniques. For example a formulation or composition of the OSC material and the polymeric additive, typically a solution encompassing one or more organic solvents, can be deposited or formed using preferred techniques that include, but are not limited to, dip coating, slot-die coating spin coating, ink jet printing, letter-press printing, screen printing, doctor blade coating, bar coating, roller printing, reverse-roller printing, offset lithography printing, flexographic printing, web printing, spray coating, brush coating, or pad printing, followed by the evaporation of the solvent employed to form such a solution. For example, an organic semiconductor material, a bank structure material and an organic dielectric material can each be deposited or formed by spin coating, flexographic printing, and inkjet printing techniques in an order appropriate to the device being formed.

In a preferred embodiment the OSC layer is prepared from a formulation comprising, in addition to the OSC and the polymeric additive(s), respectively, a casting or printing solvent.

Suitable and preferred solvents include, without limitation, cyclohexylbenzene, mesitylene, 4-methylanisole, 3,4-dimethylanisole, indan, xylene, tetralin, 1,5-dimethyltetralin, 1-methylnaphthalene, ethylbenzene, diethylbenzene, isobutylbenzene, 1,3,5-triisopropylbenzene, butylbenzene, cumene, phenetole, p-cymene, or any combinations of the aforementioned solvents.

For OSC formulations comprising a small molecule OSC, the concentration of the OSC in the formulation is preferably from 0.1 to 10%, very preferably from 0.5 to 5%.

For OSC formulations comprising a small molecule OSC, the concentration of the polymeric additive in the formulation is preferably from 0.01 to 2.0%, very preferably from 0.05 to 0.5%.

For OSC formulations comprising a polymeric OSC, the concentration of the OSC in the formulation is preferably from 0.05 to 5%.

For OSC formulations comprising a polymeric OSC, the concentration of the polymeric additive in the formulation is preferably from 0.1 to 30%.

The aforementioned concentration values refer to the formulation comprising the solvent(s) and all solid components, like OSC and polymeric additive etc.

For OSC formulations comprising a small molecule OSC, the proportion of the polymeric additive to the OSC in the formulation is preferably from 1:40 to 1:4.

For OSC formulations comprising a polymeric OSC, the proportion of the polymeric additive to the OSC in the formulation is preferably from 1:5 to 10:1.

The concentration of the polymeric additive in the OSC layer after deposition and solvent removal is preferably from 2.5 to 25%, very preferably from 10 to 15%.

Suitable process conditions for the vapor deposition process of forming the Parylene layer are known to the skilled person and are described in the literature, for example in P. Kramer et al., *Journal of Polymer Science: Polymer Chemistry Edition*, Vol. 22 (1984), pp. 475-491.

Another embodiment of the present invention relates to an organic semiconductor layer obtained through the use of a formulation in accordance with the invention.

Another embodiment of the present invention relates to a process of preparing an organic semiconductor layer, comprising the steps of depositing a formulation in accordance with the invention onto a substrate and, in case the formulation comprises a solvent, removing the solvent.

Another embodiment of the present invention relates to an organic electronic device comprising an organic semiconductor layer and a dielectric or passivation layer, wherein the organic semiconductor layer is obtained through the use of a formulation in accordance with the invention, and the dielectric or passivation layer comprises a poly(p-xylylene).

A preferred embodiment relates to an organic electronic device comprising an organic semiconductor layer and a dielectric or passivation layer, wherein the organic semiconductor layer is obtained through the use of a formulation in accordance with the invention, the dielectric or passivation layer comprises a poly(p-xylylene), and the polymeric additive of the organic semiconductor layer is chemically bonded, via one or more of its reactive groups, to the poly(p-xylylene) of the dielectric or passivation layer at the interface between the organic semiconductor layer and the dielectric or passivation layer.

Another embodiment of the present invention relates to a process of preparing an organic electronic device as described above and below, comprising the steps of a) depositing a formulation as described above and below onto a substrate to form an organic semiconductor layer, b) in case the formulation comprises a solvent, removing the solvent, c) optionally annealing the organic semiconductor layer, d) depositing a layer of a p-xylylene onto the organic semiconductor layer by vapour deposition.

The formulation according to the present invention can be used in OSC layers of OE devices. The OE devices include, among others, organic field effect transistors (OFETs), including organic thin film transistors (OTFTs) as a particular type of OFET, which can be top gate or bottom gate transistors, Organic Light Emitting Diodes (OLED), Organic Photodetector (OPD) or Organic Photovoltaic (OPV) Devices.

In a preferred embodiment of the present invention the OE device is a top gate OFET comprising a gate dielectric layer comprising a poly(p-xylylene).

In another preferred embodiment of the present invention the OE device is a bottom gate OFET comprising a passivation layer comprising a poly(p-xylylene).

Figure 1:
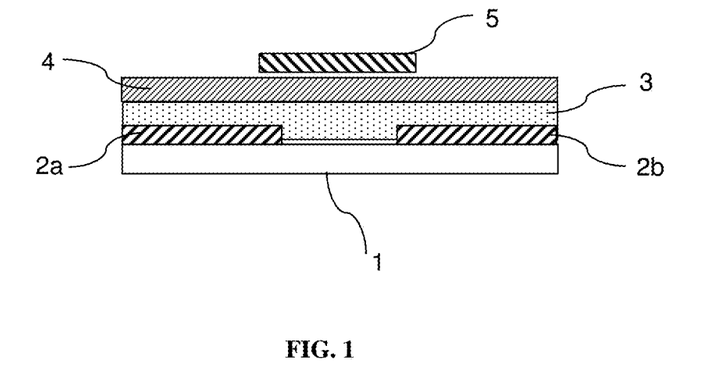
FIG. 1 is a schematic representation of a top gate OFET device in accordance with the present invention.
Figure 2:
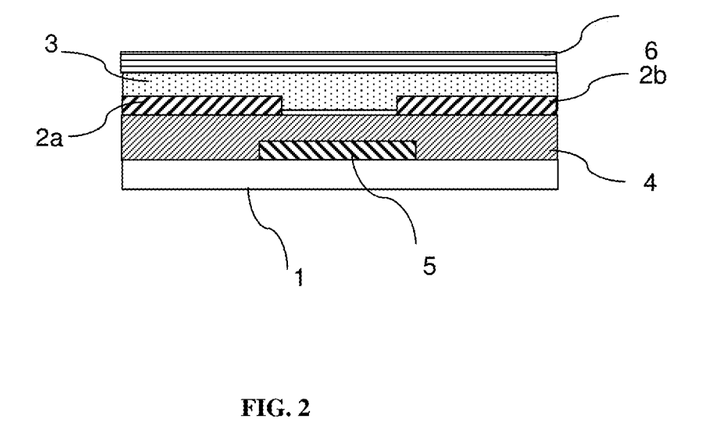
FIG. 2 is a schematic representation of a top gate OFET device in accordance with the present invention.
Figure 3:
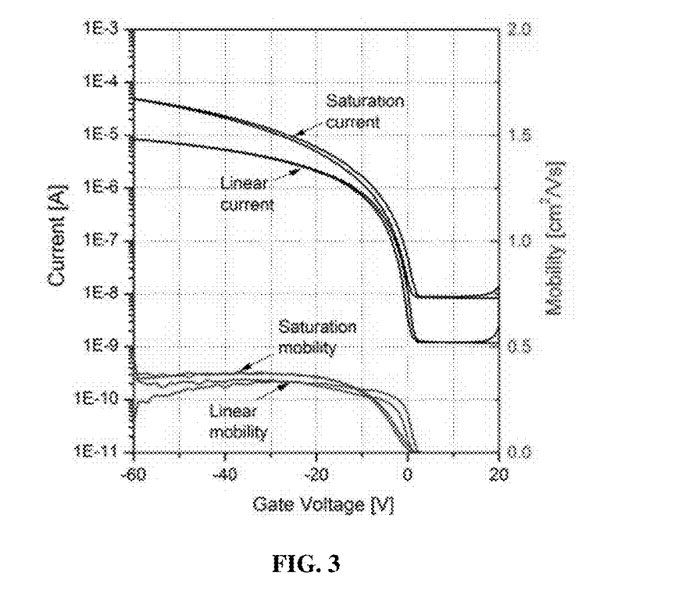
FIG. 3 depicts the transfer curve of a top gate OFET device of Example 1.
Figure 4:
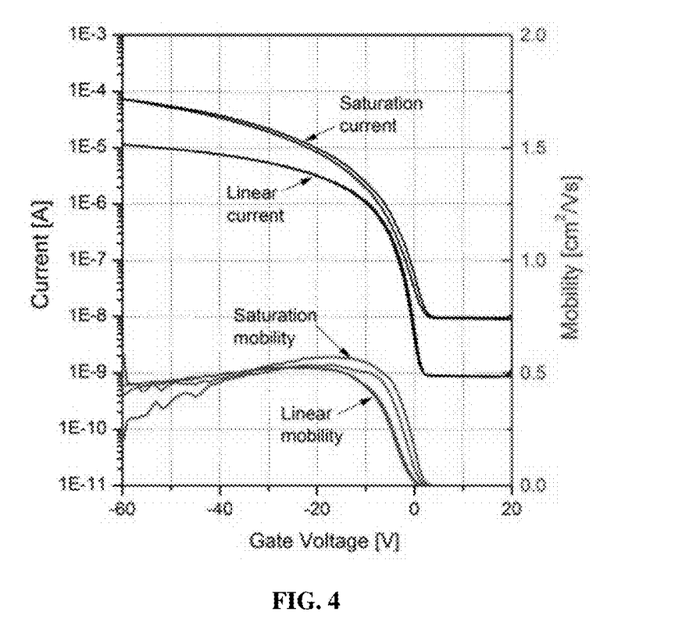
FIG. 4 depicts the transfer curve of a top gate OFET device of Example 2.

A top gate OFET in accordance with the present invention is depicted schematically in FIG. 1, and a bottom gate OFET in accordance with the present invention is depicted schematically in FIG. 2.

Turning now to FIG. 1, a schematic and simplified representation of a top gate OFET device in accordance with a preferred embodiment of the present invention is provided. Such OFET device includes a substrate (1), source and drain electrodes (2a, 2b), an organic semiconductor layer (3) obtained through the use of a formulation as described above and below, a dielectric layer (4) comprising a poly(p-xylylene) and serving as gate insulator, and a gate electrode (5).

Another embodiment of the present invention relates to a process for preparing a top gate OFET device, for example as illustrated in FIG. 1, by a process comprising the steps of A) forming source and drain electrodes (2a,2b) on a substrate (1), B) forming an organic semiconductor layer (3) from a formulation in accordance with the invention on the source and drain electrodes (2a,a,2b), C) forming a dielectric layer (4) by vapor deposition of a p-xylyene on the organic semiconductor layer (3), D) forming a gate electrode (5) on the dielectric layer (4).

Turning now to FIG. 2, a schematic and simplified representation of a bottom gate OFET device in accordance with a preferred embodiment of the present invention is provided. Such OFET device includes a substrate (1), a gate electrode (5), a dielectric layer (4) serving as gate insulator, source and drain electrodes (2a, 2b), an organic semiconductor layer (3) obtained through the use of a formulation as described above and below, and a passivation layer (6) comprising a poly(p-xylylene).

Another embodiment of the present invention relates to a process for preparing a bottom gate OFET device, for example as illustrated in FIG. 2, by a process comprising the steps of A) forming a gate electrode (5) on a substrate (1), B) forming a dielectric layer (4) on the substrate (1) and the gate electrode (5), C) forming source and drain electrodes (2a,2b) on the dielectric layer (4).

D) forming an organic semiconductor layer (3) from a formulation in accordance with the invention on the source and drain electrodes (2a,2b) and the dielectric layer (4), E) forming a passivation layer (6) by vapor deposition of a p-xylyene on the organic semiconductor layer (3).

The electrodes (2a, 2b, 5) are for example applied onto the substrate (1) or the dielectric layer (4) by a printing or a sputtering process, and can be patterned by etching and/or lithographic patterning. The OSC layer (3) and dielectric layer (4) can be applied by a coating or printing process as described above.

The other components or functional layers of the electronic device, like the substrate and the gate, source and drain electrodes, can be selected from standard materials, and can be manufactured and applied to the device by standard methods. Suitable materials and manufacturing methods for these components and layers are known to a person skilled in the art and are described in the literature. Exemplary deposition methods include the liquid coating methods previously described as well as chemical vapor deposition (CVD) or physical vapor deposition methodologies.

Generally the thickness of a functional layer, for example a gate dielectric or organic semiconductor layer, in some preferred electronic device embodiments according to the present invention is from 0.001 (in case of a monolayer) to 10 µm; In other preferred embodiments such thickness ranges from 0.001 to 1 µm, and in still other preferred embodiments from 5 nm to 500 nm, although other thicknesses or ranges of thickness are contemplated and thus are within the scope of the present invention.

Various substrates may be used for the fabrication of the electronic device embodiments of the present invention. For example glass or polymeric materials are most often used. Preferred polymeric materials include, but are not limited to, alkyd resins, allyl esters, benzocyclobutenes, butadiene-styrene, cellulose, cellulose acetate, epoxide, epoxy polymers, ethylene-chlorotrifluoro ethylene copolymers, ethylene-tetra-fluoroethylene copolymers, fiber glass enhanced plastic, fluorocarbon polymers, hexafluoropropylene-vinylidene-fluoride copolymer, high density polyethylene, parylene, polyamide, polyimide, polyaramid, polydimethylsiloxane, polyethersulphone, poly-ethylene, polyethylenenaphthalate, polyethyleneterephthalate, polyketone, polymethylmethacrylate, polypropylene, polystyrene, polysulphone, polytetrafluoroethylene, polyurethanes, polyvinylchloride, polycycloolefin, silicone rubbers, and silicones, where polyethyleneterephthalate, polyimide, polycycloolefin and polyethylenenaphthalate materials have been found most appropriate. Additionally, for some embodiments of the present invention the substrate can be any suitable material, for example plastic, metal or glass material coated with one or more of the above listed materials or with any other insulating layers. It will be understood that in forming such a substrate, methods such as extruding, stretching, rubbing or photochemical techniques can be employed to provide a homogeneous surface for device fabrication as well as to provide pre-alignment of an organic semiconductor material in order to enhance carrier mobility therein.

The gate, source and drain electrodes of the OFET device embodiments in accordance with the present invention can be deposited or formed by liquid coating, such as spray-, dip-, web- or spin-coating, or by vacuum deposition methods including but not limited to physical vapor deposition (PVD), chemical vapor deposition (CVD) or thermal evaporation methods. Suitable electrode materials and deposition methods are known to the person skilled in the art. Suitable electrode materials include, without limitation, inorganic or organic materials, or composites of the two. Exemplary electrode materials include polyaniline, polypyrrole, poly(3, 4-ethylenedioxy-thiophene) (PEDOT) or doped conjugated polymers, further dispersions or pastes of graphite or particles of metal such as Au, Ag, Cu, Al, Ni or their mixtures as well as sputter coated or evaporated metals such as Cu, Cr, Pt/Pd, Ag, Au or metal oxides such as indium tin oxide (ITO) F-doped ITO or Al-doped ZnO. Organometallic precursors may also be used and deposited from a liquid phase.

Unless the context clearly indicates otherwise, as used herein plural forms of the terms herein are to be construed as including the singular form and vice versa.

It will be appreciated that variations to the foregoing embodiments of the invention can be made while still falling within the scope of the invention. Each feature disclosed in this specification, unless stated otherwise, may be replaced by alternative features serving the same, equivalent or similar purpose. Thus, unless stated otherwise, each feature disclosed is one example only of a generic series of equivalent or similar features.

All of the features disclosed in this specification may be combined in any combination, except combinations where at least some of such features and/or steps are mutually exclusive. In particular, the features of the invention are applicable to all aspects of the invention and may be used in any combination. Likewise, features described in non-essential combinations may be used separately (not in combination).

The invention will now be described in more detail by reference to the following examples, which are illustrative only and do not limit the scope of the invention.

Above and below, unless stated otherwise percentages are percent by weight and temperatures are given in degrees Celsius (° C.).

Example 1

Teonex Q65FA® film (available from DuPont Teijin Films™) was washed in methanol.

A 1 micron layer of Lisicon® P014-MAK-175 (available from Merck KGaA) planarization material was deposited onto the Teonex film via spin coating (1500 rpm, 30 s) followed by 8 min baking at 70° C. and 4 min UV exposure (UVA 0.011 W/cm$^2$, peak at 365 nm).

Approximately 60 nm thick gold source drain electrodes were evaporated onto the Lisicon® P014-MAK-175 layer with parallel plate geometry of 20 μm wide by 1 mm long.

The electrodes were treated with Lisicon® M001(available from Merck KGaA) self assembled charge injection material for 1 min, dried and annealed on a hot plate at 70° C. for 2 min.

An OSC formulation, comprising 1.60% of 2,8-Difluoro-5,11-bis(triethylsilylethynyl) anthradithiophene, 0.20% of Poly(ethylene[70%]-co-propylene-co-5-methylene-2-norbornene) (from Sigma-Aldrich), 78.56% of cyclohexylbenzene and 19.64% of mesitylene, was then printed as a 5×5 cm wide area block on the array of source/drain electrodes on the film as described above using a RK Flexiproof 100 flexographic printing with a 6 cm$^3$/m$^2$ loaded anilox and a Cyrel HiQS flexo mat running at 70 m/min speed. The printed OSC layer was then annealed at 70° C. for 5 min.

A 800 nm layer of Parylene C was then chemically vapor deposited on the OSC layer using PDS 2010 Labcoter® manufactured by Speciality Coating Systems.

Finally a 40 nm thick gold gate electrode array was evaporated on top of the dielectric Parylene C layer in such a way that it completely covered the active channel of the devices—the area between source and drain electrodes.

The transfer characteristics was recorder at bias voltage of −5 V (linear region) and −60V (saturation region). The transfer characteristics are shown in FIG. 1.

Transfer characteristics of the transistor shown in FIG. 1 indicate good transistor performance with hole mobilities greater than 0.3 cm$^2$/Vs.

Adhesion of Parylene C to the OSC film was measured using Mecmesin MultiTest-i adhesion test system. For that purpose an adhesive tape (of suitable tack and define width: Tesa® 4965 was applied to the top surface of the Parylene film and held at a 90° angle by a clamp connected to a load cell. During the measurement the test platform moved at a preset speed whilst peeling the tape off the substrate. The platform motion maintained the tape perpendicular to the test sample. The resultant force required to peel off the top layer was recorded by a 10 N load cell and used to quantify adhesion between the two films.

As a result the adhesion force of the Parylene C to the OSC film described in that example was in the range of 0.6 to 0.9 N, whereas the adhesion of 5,11-Bis(triethylsilylethynyl) anthradithiophene and blends of that materials with commonly used binders as polystyrene, poly(4-metylstyrene), poly(α-methylstyrene), poly(4-vinylbiphenyl), and poly(triarylamine) is close to 0 N (typically below the detection limit). This shows that presence of Poly(ethylene[70%]-co-propylene-co-5-methylene-2-norbornene) in the OSC film significantly improved adhesion of Parylene C to the OSC film.

Example 2

Teonex Q65FA® film (available from DuPont Teijin Films™) was washed in methanol.

A 1 micron layer of Lisicon® P014-MAK-175 (available from Merck KGaA) planarization material was deposited onto the Teonex film via spin coating (1500 rpm, 30 s) followed by 8 min baking at 70° C. and 4 min UV exposure (UVA 0.011 W/cm$^2$, peak at 365 nm).

Approximately 60 nm thick gold source drain electrodes were evaporated onto the Lisicon® P014-MAK-175 layer with parallel plate geometry of 20 μm wide by 1 mm long.

The electrodes were treated with Lisicon® M001 (available from Merck KGaA) electrode treatment material for 1 min, dried and annealed on a hot plate at 70° C. for 2 min.

An OSC formulation, comprising 1.60% of 2,8-Difluoro-5,11-bis(triethylsilylethynyl) anthradithiophene, 0.20% of Poly(vinyl phenyl sulfide) (from Sigma-Aldrich), 78.56% of cyclohexylbenzene and 19.64% of mesitylene, was then printed as a 5×5 cm wide area block on the array of source/drain electrodes on the film as described above using a RK Flexiproof 100 flexographic printing with a 6 cm³/m² loaded anilox and a Cyrel HiQS flexo mat running at 70 m/min speed. The printed OSC layer was then annealed at 70° C. for 5 min.

A 800 nm layer of Parylene C was then chemically vapor deposited on the OSC layer using PDS 2010 Labcoter® manufactured by Speciality Coating Systems.

Finally a 40 nm thick gold gate electrode array was evaporated on top of the dielectric Parylene C layer in such a way that it completely covered the active channel of the devices—the area between source and drain electrodes.

The transfer characteristics was recorder at bias voltage of −5 V (linear region) and −60V (saturation region). The transfer characteristics are shown in FIG. 2.

Transfer characteristics of the transistor shown in FIG. 2 indicate good transistor performance with hole mobilities greater than 0.5 cm²/Vs.

Adhesion of Parylene C to the OSC film was measured using Mecmesin MultiTest-i adhesion test system. For that purpose an adhesive tape of suitable tack and define width: Tesa® 4965 was applied to the top surface of the Parylene film and held at a 90° angle by a clamp connected to a load cell. During the measurement the test platform moved at a preset speed whilst peeling the tape off the substrate. The platform motion maintained the tape perpendicular to the test sample. The resultant force required to peel off the top layer was recorded by a 10 N load cell and used to quantify adhesion between the two films.

As a result the adhesion force of the Parylene C to the OSC film described in that example was in the range of 0.6 to 0.9 N, whereas the adhesion of 5,11-Bis(triethylsilylethynyl) anthradithiophene and blends of that materials with commonly used binders as polystyrene, poly(4-metylstyrene), poly(α-methylstyrene), poly(4-vinylbiphenyl), and poly(triarylamine) is close to 0 N (typically below the detection limit). This shows that presence of Poly(vinyl phenyl sulfide) in the OSC film significantly improved adhesion of Parylene C to the OSC film.

The invention claimed is:

1. An organic electronic device comprising:
an organic semiconductor layer and a dielectric or passivation layer, wherein the organic semiconductor layer is obtained through the use of a formulation comprising an organic semiconductor and a polymeric additive, said additive comprising one or more reactive groups, and the dielectric or passivation layer comprises a poly(p-xylylene),
wherein the polymeric additive of the organic semiconductor layer is chemically bonded, via one or more of the said reactive groups, to the poly(p-xylylene) of the dielectric or passivation layer at an interface between the organic semiconductor layer and the dielectric or passivation layer.

2. The organic electronic device according to claim 1, wherein the reactive groups are capable of reacting with a p-xylylene.

3. The organic electronic device according to claim 1, wherein the reactive groups are selected from an alkene group, a norbornene group and a phenylsulfide group.

4. The organic electronic device according to claim 1, wherein the polymeric additive comprises one or more divalent repeating units of formula I wherein
$B^1$ denotes a first backbone unit,
$B^2$ denotes on each occurrence identically or differently a second, third or fourth backbone unit,
Sp denotes a spacer group, a single bond or a spiro linkage,
P denotes a reactive group or together with Sp forms a reactive group, and
a is 0, 1, 2 or 3.

5. The organic electronic device according to claim 4, wherein the polymeric additive is a polymer of formula II wherein $B^1$, $B^2$, Sp, P and a are as defined in claim 4, and n is an integer ≥1.

6. The organic electronic device according to claim 1, wherein the polymeric additive comprises one or more repeating units selected from 1-phenylsulfanyl-ethylene, methylene, ethylene, propylene, 5-methylene-2-norbornene, or combinations of the aforementioned.

7. The organic electronic device according to claim 1, wherein the polymeric additive is selected from poly(vinyl phenyl sulfide) and poly(ethylene-co-propylene-co-5-methylene-2-norbornene).

8. The organic electronic device to claim 1, wherein the organic semiconductor comprises a small molecule.

9. The organic electronic device according to claim 8, wherein the organic semiconductor comprises an oligoacene or a substituted oligoacene.

10. The organic electronic device according to claim 9, wherein the organic semiconductor comprises an oligoacene substituted with two or more alkylsilylethynyl groups.

11. The organic electronic device according to claim 9, wherein the oligoacene is an anthracene, a tetracene, a pentacene or an anthradithiophene, all of which are optionally substituted.

12. The organic electronic device according to claim 1, further comprising an organic solvent.

13. The organic electronic device according to claim 12, wherein the solvent is selected from cyclohexylbenzene, mesitylene, 4-methylanisole, 3,4-dimethylanisole, indan, xylene, tetralin, 1,5-dimethyltetralin, 1-methylnaphthalene, ethylbenzene, diethylbenzene, isobutylbenzene, 1,3,5-triisopropylbenzene, butylbenzene, cumene, phenetole, p-cymene, or any combinations of the aforementioned solvents.

14. The organic electronic device according to claim 1, wherein the organic semiconductor is a small molecule organic semiconductor, and the concentration of the organic semiconductor in the formulation is from 0.1 to 10%.

15. The organic electronic device according to claim 1, wherein the organic semiconductor is a small molecule organic semiconductor, and the concentration of the polymeric additive in the formulation is from 0.01 to 2.0%.

16. The organic electronic device according to claim 1, wherein the organic semiconductor is a polymeric organic semiconductor, and the concentration of the organic semiconductor in the formulation is from 0.05 to 5%.

17. The organic electronic device according to claim 1, wherein the organic semiconductor is a polymeric organic semiconductor, and the concentration of the polymeric additive in the formulation is from 0.1 to 30%.

18. The organic electronic device according to claim 1, wherein the organic semiconductor is a small molecule organic semiconductor, and the proportion of the polymeric additive to the organic semiconductor in the formulation is from 1:40 to 1:4.

19. The organic electronic device according to claim 1, wherein the organic semiconductor is a polymeric organic semiconductor, and the proportion of the polymeric additive to the organic semiconductor in the formulation is from 1:5 to 10:1.

20. A process of preparing an organic electronic device according to claim 1, said process comprising:
    a) depositing said formulation onto a substrate to form an organic semiconductor layer,
    b) in case said formulation comprises a solvent, removing the solvent,
    c) optionally annealing the organic semiconductor layer, and
    d) depositing a layer of a p-xylylene onto the organic semiconductor layer by vapor deposition.

21. The organic electronic device according to claim 1, wherein said device is an Organic Field Effect Transistor, Organic Thin Film Transistor, Organic Light Emitting Diode or Organic Photovoltaic device.

22. The organic electronic device according to claim 21, wherein said device is a top gate Organic Field Effect Transistor or bottom gate Organic Field Effect Transistor.

23. The top gate Organic Field Effect Transistor according to claim 22, wherein said device comprises a substrate (1), source and drain electrodes (2a, 2b), an organic semiconductor layer (3) obtained through the use of said formulation, a dielectric layer (4) comprising a poly(p-xylylene) and serving as gate insulator, and gate electrode (5).

24. A process for preparing an Organic Field Effect Transistor according to claim 23, said process comprising:
    A) forming source and drain electrodes (2a,2b) on a substrate (1),
    B) forming an organic semiconductor layer (3) from said formulation on the source and drain electrodes (2a,2b),
    C) forming a dielectric layer (4) by vapor deposition of a p-xylyene on the organic semiconductor layer (3), and
    D) forming a gate electrode (5) on the dielectric layer (4).

25. The bottom gate Organic Field Effect Transistor according to claim 22, wherein said device comprises a substrate (1), a gate electrode (5), a dielectric layer (4) serving as gate insulator, source and drain electrodes (2a, 2b), an organic semiconductor layer (3) obtained through the use of said formulation, and a passivation layer (6) comprising a poly(p-xylylene).

26. A process for preparing an Organic Field Effect Transistor according to claim 25, said process comprising:
    A) forming a gate electrode (5) on a substrate (1),
    B) forming a dielectric layer (4) on the substrate (1) and the gate electrode (5),
    C) forming source and drain electrodes (2a,2b) on the dielectric layer (4),
    D) forming an organic semiconductor layer (3) from said formulation on the source and drain electrodes (2a,2b) and the dielectric layer (4),
    E) forming a passivation layer (6) by vapor deposition of a p-xylyene on the organic semiconductor layer (3).

27. A product or assembly comprising an organic electronic device according to claim 1, which is an Integrated Circuit, a Radio Frequency Identification tag, a security marking or security device containing an tag, a Flat Panel Display, a backplane of an, a backlight of an, an electrophotographic device, an electrophotographic recording device, an organic memory device, a pressure sensor, an optical sensor, a chemical sensor, a biosensor or a biochip.

28. The organic electronic device according to claim 1, wherein said reactive groups are selected from unsaturated hydrocarbon groups, O-aryl groups, and S-aryl groups.

29. The organic electronic device according to claim 1, wherein said reactive groups are selected from alkene groups, an alkyne groups, phenylsulfanyl groups and optionally substituted norbornene groups.

* * * * *